United States Patent
Jung et al.

(10) Patent No.: US 7,888,718 B2
(45) Date of Patent: Feb. 15, 2011

(54) CHARGE-DIPOLE COUPLED INFORMATION STORAGE MEDIUM

(75) Inventors: Ju-hwan Jung, Seoul (KR); Seung-bum Hong, Seongnam-si (KR); Hong-sik Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/996,057

(22) Filed: Nov. 24, 2004

(65) Prior Publication Data
US 2005/0133841 A1 Jun. 23, 2005

(30) Foreign Application Priority Data
Nov. 24, 2003 (KR) .................. 10-2003-0083616

(51) Int. Cl.
*H01L 21/02* (2006.01)
(52) U.S. Cl. .................. 257/295; 257/310; 257/306; 257/E21.648
(58) Field of Classification Search .................. 257/295, 257/315, 532, 751, E21.008, 200, 306, 310, 257/E21.648, E21.664, E27.089, E27.104; 428/900; 438/776, 396, 775, 777
See application file for complete search history.

(56) References Cited

U.S. PATENT DOCUMENTS

| 5,739,066 | A | * | 4/1998 | Pan | 438/595 |
|---|---|---|---|---|---|
| 5,985,404 | A | * | 11/1999 | Yano et al. | 428/846.1 |
| 6,096,597 | A | * | 8/2000 | Tsu et al. | 438/240 |
| 6,172,907 | B1 | * | 1/2001 | Jenne | 365/185.18 |
| 6,190,963 | B1 | * | 2/2001 | Zhang et al. | 438/254 |
| 6,392,934 | B1 | | 5/2002 | Saluel et al. | |
| 6,495,413 | B2 | * | 12/2002 | Sun et al. | 438/240 |
| 6,507,552 | B2 | * | 1/2003 | Gibson | 369/126 |
| 6,566,753 | B2 | * | 5/2003 | Zhang et al. | 257/751 |
| 6,800,890 | B1 | * | 10/2004 | Wohlfahrt et al. | 257/295 |
| 6,803,641 | B2 | * | 10/2004 | Papa Rao et al. | 257/532 |
| 6,891,715 | B2 | * | 5/2005 | Mikawa et al. | 361/311 |
| 2003/0025148 | A1 | * | 2/2003 | Hsieh et al. | 257/315 |
| 2003/0071294 | A1 | * | 4/2003 | Sun et al. | 257/295 |

FOREIGN PATENT DOCUMENTS

| EP | 1 315 157 A2 | 5/2003 |
|---|---|---|
| EP | 1 318 513 A2 | 6/2003 |
| JP | 9-198729 | 7/1997 |
| KR | 2001-0073306 | 8/2001 |

* cited by examiner

*Primary Examiner*—Zandra Smith
*Assistant Examiner*—Tsz K Chiu
(74) *Attorney, Agent, or Firm*—Sughrue Mion, PLLC

(57) ABSTRACT

An information storage medium in which charges and electric dipoles are coupled with one another. The information storage medium includes a substrate, an electrode layer formed on the substrate, a ferroelectric layer formed on the electrode layer, and an insulating layer formed on the ferroelectric layer. Accordingly, it is possible to stably record information on the information storage medium.

8 Claims, 4 Drawing Sheets

CHARGE-DIPOLE COUPLED INFORMATION STORAGE MEDIUM

BACKGROUND OF THE INVENTION

This application claims the priority of Korean Patent Application No. 2003-83616 filed on Nov. 24, 2003 in the Korean Intellectual Property Office, the disclosure of which is incorporated herein in its entirety by reference.

1. Field of the Invention

The present invention relates to an information storage medium, and more particularly, to a charge-dipole information storage medium having an improved storage capability by coupling an electric dipole obtained as a result of the ferroelectric effect to electric charges obtained via charge trapping.

2. Description of the Related Art

Conventional information storage media store information by making use of the charge trapping phenomenon or spontaneous polarization of a ferroelectric. More specifically, information is stored on an information storage medium using the charge trapping phenomenon by trapping electric charges into a thin film formed of an insulating or dielectric material such as $SiO_2$, $Si_3N_4$, or ONO (Oxide/Nitride/Oxide). In general, free movement of electric charges in such a material is restricted. For instance, when electric charges are externally injected into such a dielectric material, the injected electric charges are trapped into trap sites of the dielectric material. This phenomenon is called charge trapping, and information can be stored by making use of charge trapping. However, when the trapped electric charges are electrically connected to the outside, they can easily escape from the dielectric material. Therefore, it is difficult to confine the injected electric charges into an information storage medium by charge trapping over a long period of time.

An information storage media which stores information by spontaneous polarization makes use of the characteristics of ferroelectrics. In general, by applying an electric field to a material a dipole moment is created, thus causing electric polarization. However, there is a particular material, called a ferroelectric, in which spontaneous polarization can occur without applying an electric field. A ferroelectric exhibits spontaneous polarization that can be reversed by applying an electric field. Lead zirconate titanate (PZT) is a representative ferroelectric expressed as $Pb(Zr,Ti)O_3$. In an $ABO_3$ perovskite crystal structure, a metal ion of Pb occupies the A-site of this structure, and Zr and Ti occupy the B-site in stoichiometric amounts. In general, a ferroelectric must exhibit a large polarization, fine tolerance for polarization fatigue, and high-speed polarization conversion.

As described above, information is written to or read from conventional information storage media, by making use of electric charge trapping or dipole characteristics.

FIGS. 1A and 1B illustrate conventional information storage media using a trapping media and a ferroelectric, respectively.

More specifically, FIG. 1A is a cross-sectional view of a conventional information storage medium using a trapping medium. Referring to FIG. 1A, a charge trapping layer 12, which traps electric charges therein, is formed on a substrate 11. The charge trapping layer 12 is formed of an insulating material such as $SiO_2$, $Si_3N_4$, or ONO. When an electric potential is applied to the charge trapping layer 12, negative charges and positive charges are trapped and distributed as shown in FIG. 1A. In other words, the negative and positive charges form an electric field that is a long-range electric field. Accordingly, it is possible to detect electric charges without contacting the information storage medium with a probe used to write information on or read information from the information storage medium. However, even though the negative and positive charges form a long-range electric field, the information storage medium is disadvantageous in that its information retention time is very short.

FIG. 1B is a cross-sectional view of an information storage medium using a ferroelectric capable of generating electric dipoles. Referring to FIG. 1B, a ferroelectric layer 13, which generates electric dipoles, is formed on a substrate 11. In general, the ferroelectric layer 13 includes a PZT that is a ferroelectric. Application of an electric potential to the ferroelectric layer 13 causes electric polarization to occur as shown in FIG. 1B. Electric polarization causes formation of an electric field that has a shorter range than that of FIG. 1A due to charge trapping. Accordingly, a very short distance must be set between the information storage medium and a probe to write information to or read information from the information storage medium of FIG. 1B. Although the retention time of information stored in an information storage medium such as that shown in FIG. 1B is long, the probe must operate while contacting the information storage medium so as to measure the magnitude of an electric field generated by the electric dipoles. Consequently, the probe and the information recording media may become worn due to their mutual contact. Also, it is difficult to control problems caused by screening charges occurring on the ferroelectric layer 13 due to dust or moisture.

SUMMARY OF THE INVENTION

It is therefore an object of the present invention to provide an information storage medium using a ferroelectric having an improved structure, by which information retention time is increased and which allows information stored therein to be easily recognized.

The above object has been achieved in a first aspect of the present invention by providing an information storage medium including a substrate, an electrode layer formed on the substrate, a ferroelectric layer formed on the electrode layer, and an insulating layer formed on the ferroelectric layer.

In a preferred embodiment, the ferroelectric layer comprises lead zirconate titanate (PZT).

In another preferred embodiment, the insulating layer comprises a material that allows charges to be trapped by applying an electric potential.

In a preferred embodiment, the insulating layer is formed of a material selected from the group consisting of diamond-like-carbon (DLC), $SiO_2$, $Si_3N_4$, an oxide/nitride/oxide (ONO) structure, $Al_2O_3$ and IrO.

The above object has also been achieved in accordance with a second aspect of the present invention by providing a method of manufacturing an information storage medium, the method including the steps of (a) forming an electrode layer on a substrate, (b) forming a ferroelectric layer on the electrode layer, and (c) forming an insulating layer on the ferroelectric layer.

In a preferred embodiment, in step (b), a ferroelectric containing lead zirconate titanate (PZT) is applied to the electrode layer.

In another preferred embodiment, in step (c), an insulating layer containing a material selected from the group consisting of diamond-like-carbon (DLC), SiO$_2$, Si$_3$N$_4$, Al$_2$O$_3$ and IrO is formed on the ferroelectric layer.

BRIEF DESCRIPTION OF THE DRAWINGS

The above and other aspects and advantages of the present invention will become more apparent by describing in detail exemplary embodiments thereof with reference to the attached drawings in which.

DETAILED DESCRIPTION OF THE INVENTION

The invention is described in further detail by reference to the drawings. However, the present invention should not be construed as being limited thereto.

Figure 2:
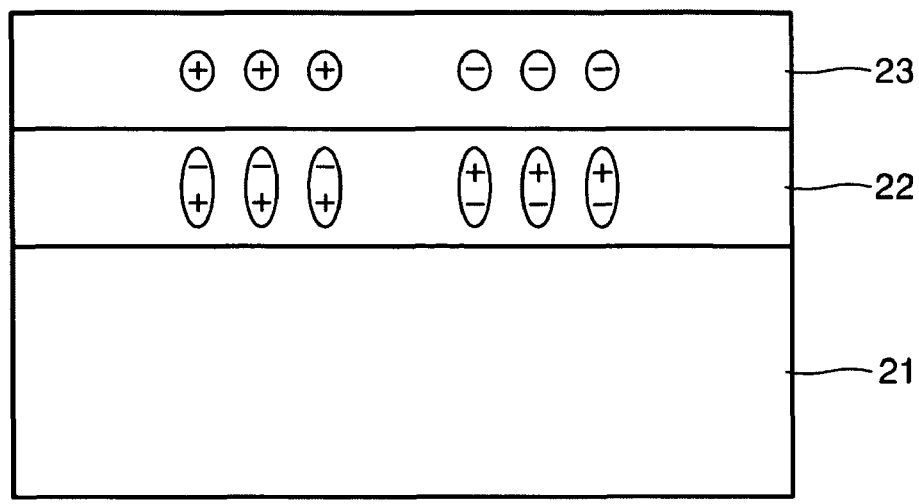
FIG. 2 is a cross-sectional view of an information storage medium according to an embodiment of the present invention.

Referring to FIG. 2, an information storage medium according to an embodiment of the present invention includes a substrate 21, a ferroelectric layer 22 formed on the substrate 21, and an insulating layer 23 formed on the ferroelectric layer 22. The type of substrate 21 is not particularly limited.

The ferroelectric layer 22 may be formed of a generally known ferroelectric such as lead zirconate titanate (PZT) or lead lantha-num zirconate titanate (PZLT), using a sol gel process, by chemical vapor deposition (CVD), or by sputtering. Spontaneous electric polarization can occur in the ferroelectric layer 22 without applying an electric field. Also, the material for the ferroelectric layer 22 exhibits spontaneous polarization that can be reversed by applying an electric field. The ferroelectric layer may be formed to a thickness of from about 10 to 500 nm.

The insulating layer 23 formed on the ferroelectric layer 22 may be formed of a material suitable for charge trapping, such as diamond-like-carbon (DLC), SiO$_2$, Si$_3$N$_4$, an ONO structure, Al$_2$O$_3$, or IrO, by CVD or sputtering. The insulating layer may be formed to a thickness from about 5 to 300 nm.

Figure 3:
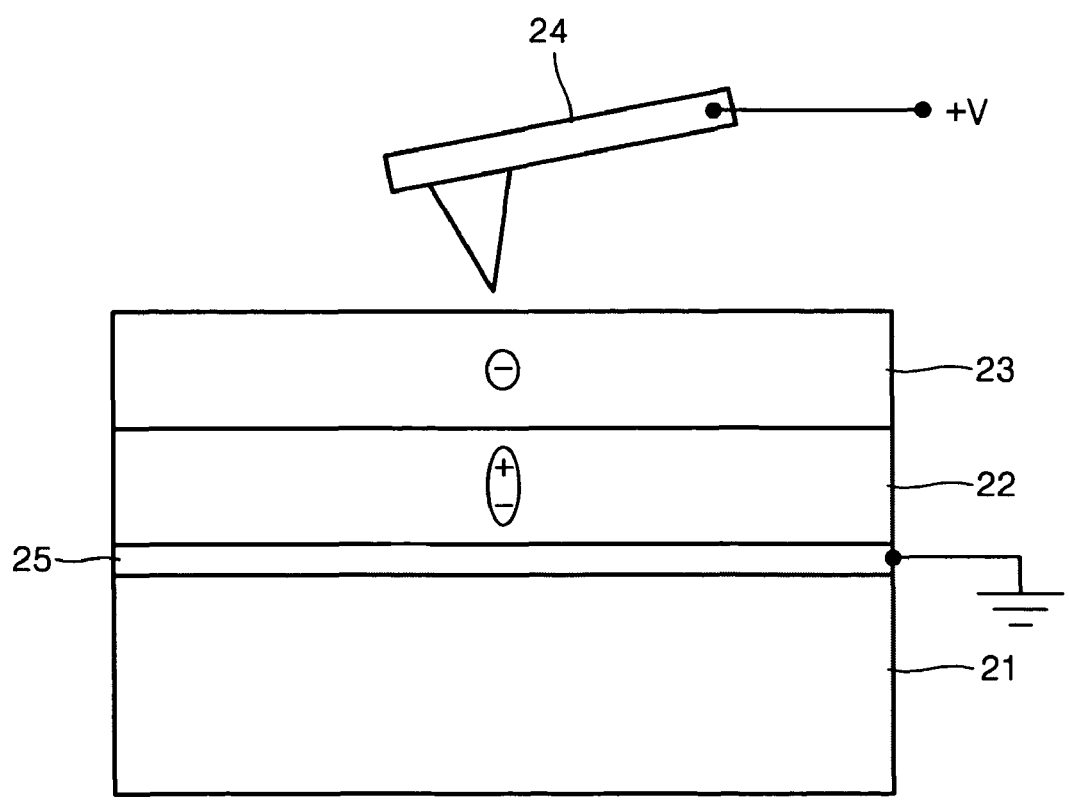
FIG. 3 is a cross-sectional view of an information storage medium according to an embodiment of the present invention, explaining a process of writing information to and reading information from the information storage medium.

An information storage medium using a ferroelectric, according to the present invention, will now be described in detail with reference to FIGS. 2 and 3. FIG. 3 is a cross-sectional view of an information storage medium according to an embodiment of the present invention for explaining a process of writing information to and reading information from the information storage medium. Referring to FIG. 3, a ferroelectric layer 22 and an insulating layer 23 are sequentially formed on a substrate 21. An electrode layer 25 may further be included between the substrate 21 and the ferroelectric layer 22 as shown in FIG. 3, so that an electric potential can be applied to the information storage medium for performing a write/read operation on the information storage medium therefrom. Also, as shown in FIG. 3, a probe 24 is positioned over the insulating layer 23 to write information to or read information from the information storage medium. The probe 24 may be one of various types of conductive probes available for a Scanning Capacitance Microscope (SCM) or an Electrostatic Force Microscope (EFM).

When an electric potential is applied to the information storage medium using the probe 24, charges are trapped in the insulating layer 23. Assuming that a positive potential is applied to the insulating layer 23 using the probe 24, negative charges are trapped in a portion of the insulating layer 23 corresponding to a tip of the probe 24. In this case, as shown in FIG. 3, a plurality of electric dipoles, an upper part of each of the electric dipoles having a positive charge and a lower part of each of the electric dipoles having a negative charge, are aligned in the ferroelectric layer 22 under the insulating layer 23. Accordingly, application of an electric potential via the probe 24 causes the charges trapped in the insulating layer 23 and the electric dipoles in the ferroelectric layer 22 to be aligned throughout the information storage medium in a predetermined form, according to the polarity of the applied electric potential. In this way, information can be written to an information storage medium according to the present invention.

An example of a process of reading charges aligned in the information storage medium in the predetermined form, i.e., information recorded thereon, will now be described. The charges trapped in the insulating layer 23 and the electric dipoles in the ferroelectric layer 22 are aligned to form a long-range electric field when containing information. A change in the electric field can be measured via the EFM or an SCM. In this connection, Korean Patent Application No. 2002-0025400 filed May 8, 2002, incorporated herein by reference, discloses a method of reading information from an information storage medium by measuring a resistance value of a resistive probe that changes with a change in electric field. In other words, the desired information can be obtained by reading an information value at a position of the resistive value.

Figure 1A:
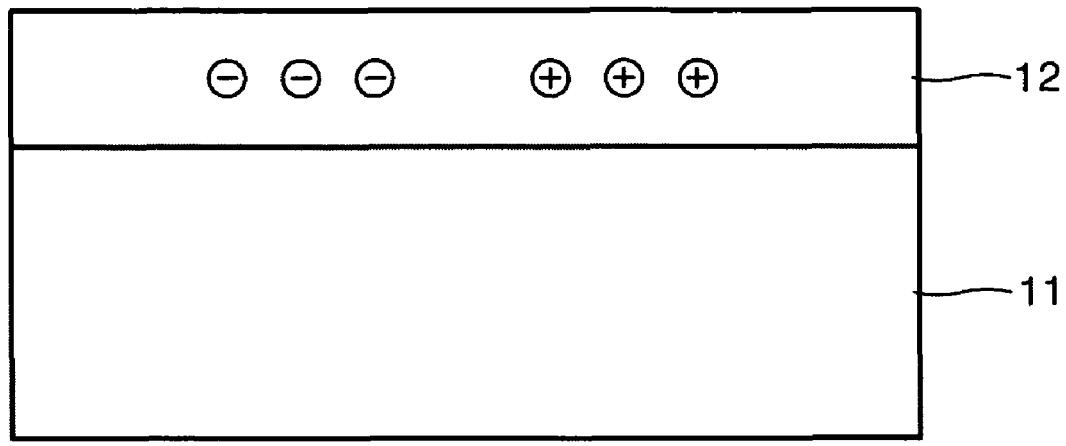
FIGS. 1A and 1B are cross-sectional views of conventional information storage media.
Figure 1B:
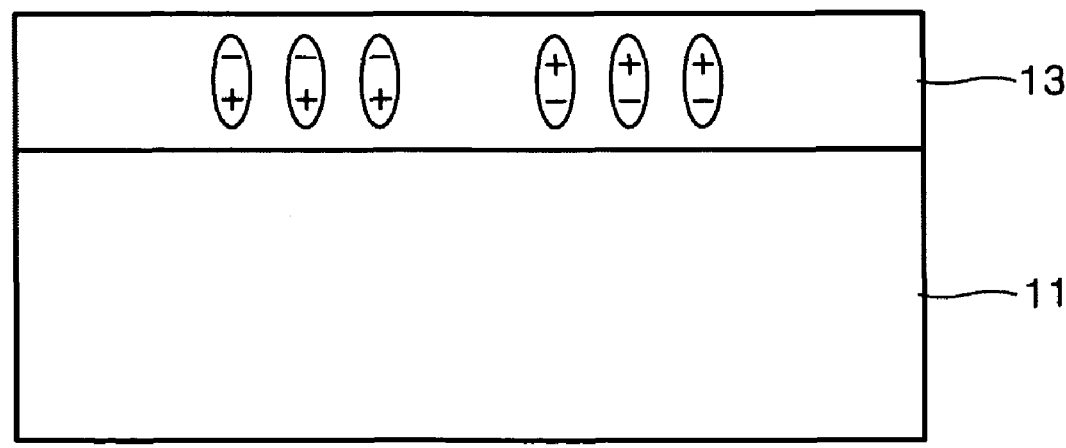

In order to demonstrate the effects of the invention, an information storage medium according to the present invention and a conventional information storage medium were manufactured and their electrical characteristic values were measured. First, a conventional information storage medium using a ferroelectric, such as that shown in FIG. 1B, was manufactured. A lower electrode was further included between a substrate and ferroelectric layer. That is, a lower electrode was formed on the substrate and the ferroelectric layer was formed on the lower electrode. The substrate was formed of silicon (Si). The lower electrode was formed of platinum/titanium (Pt/Ti) to a thickness of about 150 nm/10 nm, by sputtering. The ferroelectric layer was formed of a PZT to a thickness of about 150 nm, using the sol gel process.

Next, an information storage medium, such as that shown in FIG. 3, was manufactured. In detail, a lower electrode was formed on a substrate, and a ferroelectric layer and an insulating layer were sequentially formed on the lower electrode. A Si substrate was used as the substrate. The lower electrode was formed of Pt/Ti to a thickness of about 150 nm/10 nm. The ferroelectric layer was formed of a PZT to a thickness of about 150 nm and the insulating layer was formed of Al$_2$O$_3$ to a thickness of about 10 nm.

Figure 4A:
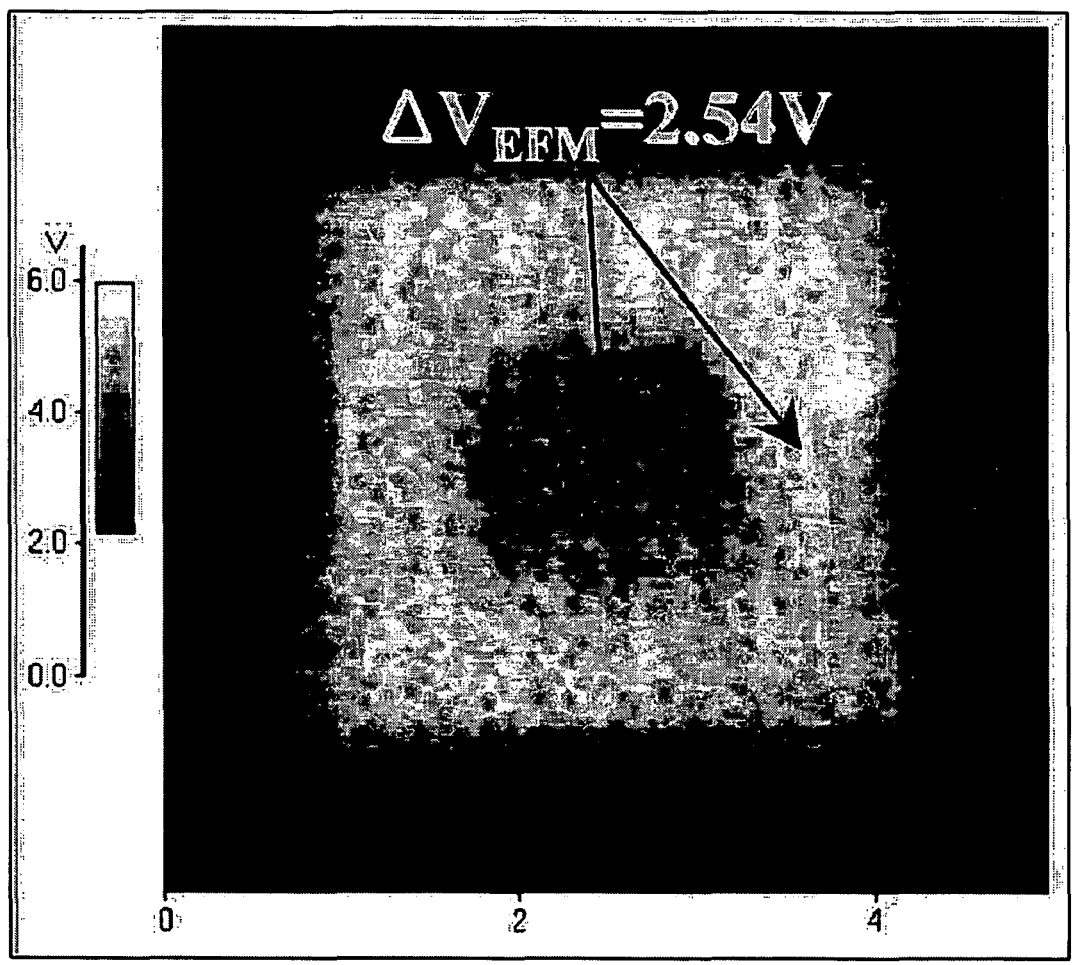
FIG. 4A illustrates a portion of a conventional information storage medium observed via an electrostatic force microscope (EFM)
Figure 4B:
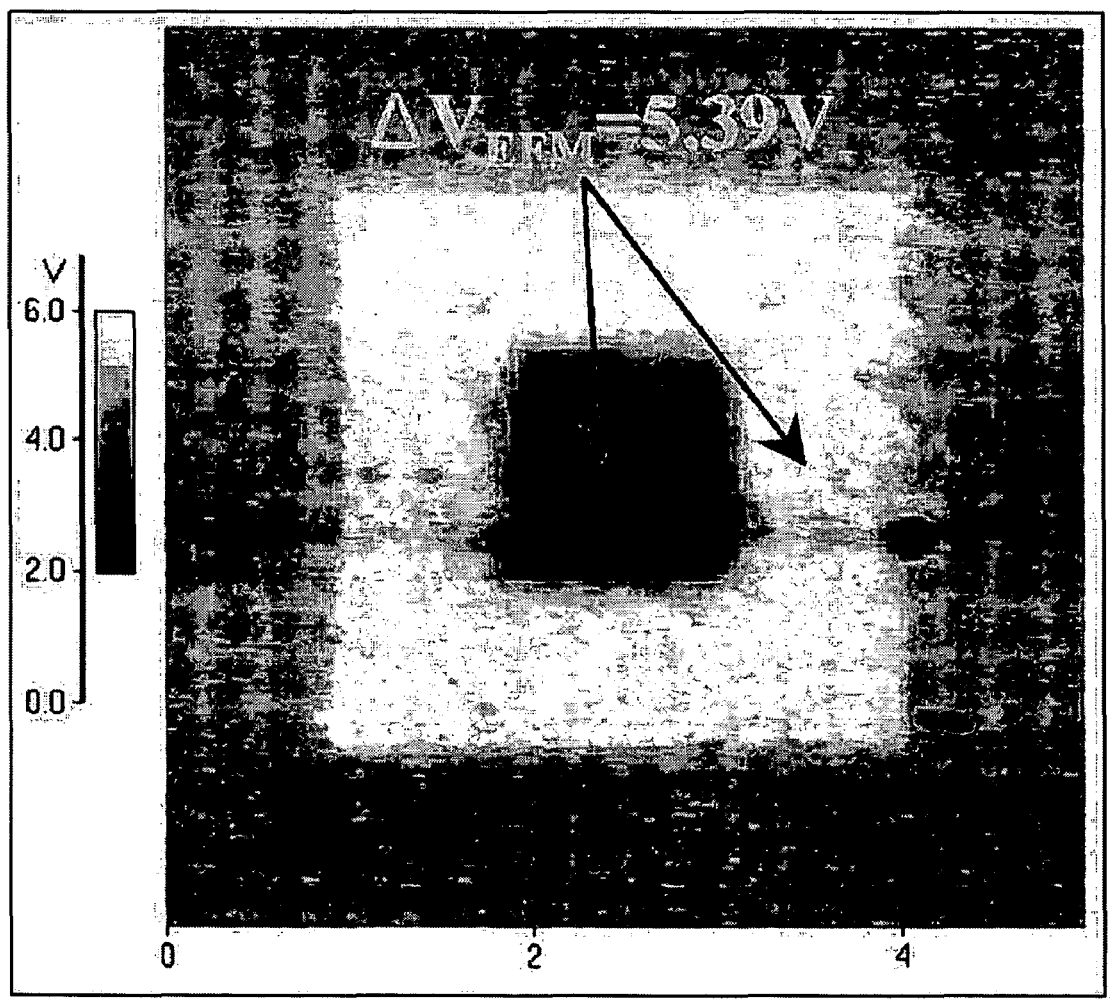
FIG. 4B illustrates a portion of an information storage medium observed via the EFM, according to an embodiment of the present invention.

Next, as shown in FIGS. 4A and 4B, test sample regions of 5×5 μm of the conventional information storage medium and the information storage medium according to the present invention were determined to examine their electrical characteristics using the EFM. Next, charges were applied to 3×3 μm portions of the test sample regions using a probe, such that the charges were evenly distributed therein. Next, charges whose polarities opposite those of the charges applied to the portions of 3×3 μm, were applied to 1×1 μm portions of the 3×3 µm portions. The 3×3 µm portions are peripheral regions of the 1×1 µm portions that are central regions, ranging from about 1 µm to 4 µm of the x-axes and y-axes of the diagrams of FIGS. 4A and 4B. An electric potential of ±10V was applied onto the central and peripheral portions using the probe. As compared to the conventional information storage medium of FIG. 4A, a border between the central region and the peripheral region in the present information storage medium of FIG. 4B was clearly seen. That is, the above comparative experimentation reveals that the recording stability of the present information storage medium is greater than that of a conventional information storage medium. In other words, a degree of noise occurring when recording data on the present information storage medium is far smaller than the degree of noise occurring when recording data on the conventional information storage medium. Also, a width of the border between the central region and the peripheral region of the present information storage medium is smaller than that of a border between the central region and the peripheral region of the conventional information storage medium. This means that more information can be recorded on the present information storage medium than on the conventional information storage medium.

The information storage medium of the present invention is characterized as having, sequentially formed, a ferroelectric layer and an insulating layer in which charges are trapped, thus allowing information to be stably recorded thereon. Formation of a long-range electric field enables information to be satisfactorily read without making probe contact to the information storage medium. Therefore, it is possible to prevent the probe and the information storage medium from becoming worn due to mutual contact. Because the insulating layer for charge trapping is formed on the ferroelectric layer, the insulating layer protects the ferroelectric layer and prevents the occurrence of screening charges caused when a ferroelectric layer alone is formed on a substrate. Further, since the distance between a portion containing information recorded using a positive voltage and a portion containing information recorded using a negative voltage is reduced, more information can be stored in a limited area.

While this invention has been particularly shown and described with reference to exemplary embodiments thereof, it will be understood by those skilled in the art that various changes in form and detail may be made therein without departing from the spirit and scope of the invention as defined by the appended claims.

What is claimed is:

1. An information storage medium comprising:
    a substrate;
    an electrode layer formed on the substrate;
    a ferroelectric layer formed on the electrode layer; and
    an insulating layer in which charges aligning electric dipoles in the ferroelectric layer are trapped formed on the ferroelectric layer, wherein the insulating layer comprises a material that allows charges to be trapped by applying an electric potential selected from the group consisting of an oxide/nitride/oxide (ONO) structure and IrO.

2. The information storage medium as claimed in claim 1, wherein the ferroelectric layer comprises a lead zirconate titanate (PZT).

3. The information storage medium as claimed in claim 1, wherein the ferroelectric layer is formed to a thickness of about from 10 nm to 500nm.

4. The information storage medium as claimed in claim 1, wherein the insulating layer is formed to a thickness of about from 5 nm to 300 nm.

5. A method of manufacturing an information storage medium comprising:
    a substrate;
    an electrode layer formed on the substrate;
    a ferroelectric layer formed on the electrode layer; and
    an insulating layer in which charges aligning electric dipoles in the ferroelectric layer are trapped formed on the ferroelectric layer, wherein the insulating layer comprises a material that allows charges to be trapped by applying an electric potential selected from the group consisting of an oxide/nitride/oxide (ONO) structure and IrO, said method comprising:
    (a) forming an electrode layer on a substrate;
    (b) forming a ferroelectric layer on the electrode layer; and
    (c) forming an insulating layer on the ferroelectric layer.

6. The method as claimed in claim 5, wherein step (b) comprises applying ferroelectric containing lead zirconate titanate (PZT) to the electrode layer.

7. An information storage apparatus comprising:
    a substrate;
    an electrode layer formed on the substrate;
    a ferroelectric layer formed on the electrode layer;
    an insulating layer in which charges aligning electric dipoles in the ferroelectric layer are trapped formed on the ferroelectric layer; and
    a probe formed above the insulating layer, said probe causing the charges to become trapped in the insulating layer, wherein the insulating layer comprises a material that allows charges to be trapped by applying an electric potential selected from the group consisting of an oxide/nitride/oxide (ONO) structure and IrO.

8. A method of recording information in an information storage apparatus comprising:
    a substrate;
    an electrode layer formed on the substrate;
    a ferroelectric layer formed on the electrode layer;
    an insulating layer in which charges aligning electric dipoles in the ferroelectric layer are trapped formed on the ferroelectric layer, wherein the insulating layer comprises a material that allows charges to be trapped by applying an electric potential selected from the group consisting of an oxide/nitride/oxide (ONO) structure and IrO; and
    a probe formed above the insulating layer, said probe causing the charges to become trapped in the insulating layer, said method comprising:
    (a) applying an electric potential to the insulating layer using the probe;
    (b) trapping charges in a portion of the insulating layer; and
    (c) aligning electric dipoles in the ferroelectric layer.

* * * * *